United States Patent
Berge et al.

(10) Patent No.: US 10,104,772 B2
(45) Date of Patent: Oct. 16, 2018

(54) METALLIZED PARTICLE INTERCONNECT WITH SOLDER COMPONENTS

(71) Applicant: International Business Machines Corporation, Armonk, NY (US)

(72) Inventors: Layne A. Berge, Rochester, MN (US); John R. Dangler, Rochester, MN (US); Matthew S. Doyle, Rochester, MN (US); Jesse Hefner, Rochester, MN (US)

(73) Assignee: International Business Machines Incorporated, Armonk, NY (US)

( * ) Notice: Subject to any disclaimer, the term of this patent is extended or adjusted under 35 U.S.C. 154(b) by 57 days.

(21) Appl. No.: 14/462,721

(22) Filed: Aug. 19, 2014

(65) Prior Publication Data

US 2016/0057860 A1  Feb. 25, 2016

(51) Int. Cl.
*B23K 1/00* (2006.01)
*H05K 3/34* (2006.01)
(Continued)

(52) U.S. Cl.
CPC ............. *H05K 1/14* (2013.01); *B23K 1/008* (2013.01); *B23K 1/0016* (2013.01); *B23K 1/19* (2013.01); *B23K 3/047* (2013.01); *B23K 3/087* (2013.01); *H05K 1/181* (2013.01); *B23K 2201/42* (2013.01); *H05K 2201/1053* (2013.01); *H05K 2201/10515* (2013.01); *H05K 2203/0278* (2013.01); *Y02P 70/611* (2015.11)

(58) Field of Classification Search
CPC ................................ B23K 1/0016; H05K 1/111
See application file for complete search history.

(56) References Cited

U.S. PATENT DOCUMENTS 4,740,657 A * 4/1988 Tsukagoshi ............. H01B 1/22
                                                                  174/84 R
4,814,040 A    3/1989 Ozawa
(Continued)

FOREIGN PATENT DOCUMENTS

| CN | 102522366 A | 6/2012 |
| JP | 63237426 A | 10/1988 |
| JP | 2012138583 A1 | 10/2012 |

OTHER PUBLICATIONS

"Tyco Offers MPI Technology Gained in Thomas & Betts OEM Purchase", PRNewswire Online Article, Tyco Electronics, 2000.*
(Continued)

*Primary Examiner* — Devang R Patel
(74) *Attorney, Agent, or Firm* — Wood, Herron & Evans, LLP; Robert R. Williams

(57) ABSTRACT

An electrical connection is established between a first electrical component and a second electrical component of an assembly and a compression tool is used to apply a compression force to the assembly. The assembly also includes a metallized particle interconnect (MPI) between the first electrical component and the second electrical component and solder components outside a boundary of the MPI and extending from the first electrical component to the second electrical component. The solder components are melted by applying heat to the assembly. The solder components are solidified by cooling the assembly and the compression tool is removed.

9 Claims, 5 Drawing Sheets

(51) Int. Cl.

| | | |
|---|---|---|
| *H05K 1/14* | (2006.01) | |
| *H05K 1/18* | (2006.01) | |
| *B23K 1/008* | (2006.01) | |
| *B23K 1/19* | (2006.01) | |
| *B23K 3/047* | (2006.01) | |
| *B23K 3/08* | (2006.01) | |
| *B23K 101/42* | (2006.01) | |

(56) References Cited

U.S. PATENT DOCUMENTS

| | | | | |
|---|---|---|---|---|
| 4,820,376 | A * | 4/1989 | Lambert | B29C 70/64 216/11 |
| 4,887,760 | A * | 12/1989 | Yoshino | H01L 21/4839 228/180.22 |
| 5,083,697 | A * | 1/1992 | Difrancesco | B23K 20/16 228/116 |
| 5,162,613 | A * | 11/1992 | Schoenthaler | H01L 23/49883 174/260 |
| 5,210,938 | A * | 5/1993 | Hirai | H01L 21/563 156/276 |
| 5,346,857 | A * | 9/1994 | Scharr | H01L 24/75 228/180.22 |
| 5,509,815 | A * | 4/1996 | Jin | B23K 35/0222 228/180.22 |
| 5,667,884 | A | 9/1997 | Bolger | |
| 5,727,310 | A | 3/1998 | Casson et al. | |
| 5,824,568 | A | 10/1998 | Zechman | |
| 5,949,029 | A | 9/1999 | Crotzer et al. | |
| 6,013,571 | A * | 1/2000 | Morrell | H01L 24/16 257/E21.511 |
| 6,056,557 | A | 5/2000 | Crotzer et al. | |
| 6,100,597 | A * | 8/2000 | Nakamura | H01L 21/563 257/737 |
| 6,196,443 | B1 * | 3/2001 | DiGiacomo | H05K 3/3436 228/180.22 |
| 6,283,359 | B1 * | 9/2001 | Brofman | B23K 35/0222 228/180.21 |
| 6,325,552 | B1 * | 12/2001 | Brillhart | H05K 3/325 385/88 |
| 6,550,665 | B1 * | 4/2003 | Parrish | B23K 35/26 228/180.21 |
| 6,762,495 | B1 | 7/2004 | Reyes et al. | |
| 6,787,924 | B2 | 9/2004 | Tsunemasu | |
| 6,932,618 | B1 | 8/2005 | Nelson | |
| 7,177,142 | B2 | 2/2007 | Kabadi et al. | |
| 7,413,106 | B2 | 8/2008 | Wuersch et al. | |
| 7,795,743 | B2 | 9/2010 | Kim et al. | |
| 7,946,856 | B2 * | 5/2011 | Jaeger | H01R 12/714 439/66 |
| 8,381,965 | B2 * | 2/2013 | Jang | H01L 24/16 228/180.22 |
| 8,525,346 | B2 | 9/2013 | Rathburn | |
| 2003/0228774 | A1 | 12/2003 | Zaderej | |
| 2006/0091538 | A1 * | 5/2006 | Kabadi | H05K 7/1061 257/737 |
| 2009/0124100 | A1 * | 5/2009 | Mason | H05K 7/1061 439/66 |
| 2012/0262862 | A1 * | 10/2012 | Johnson | G06F 1/32 361/679.02 |
| 2016/0057861 | A1 | 2/2016 | Berge et al. | |

OTHER PUBLICATIONS

Berge et al., "Metallized Particle Interconnect with Solder Components," U.S. Appl. No. 14/510,466, filed Oct. 9, 2014.

List of IBM Patents or Patent Applications Treated as Related.

Jalar et al., "Mechanical Properties of Sn3.5Ag and Sn3.8Ag0.7Cu Solder Balls for BGA Package", International Journal of Engineering and Technology, 2007, pp. 221-227, vol. 4, No. 2, ISSN 1823-1039, © 2007 FEIIC. http://ijet.feiic.org/journals/J-2007-V2010.pdf.

\* cited by examiner

METALLIZED PARTICLE INTERCONNECT WITH SOLDER COMPONENTS

BACKGROUND

The present disclosure relates to connecting electrical components, and more specifically, to connecting electrical components using a metallized particle interconnect (MPI) and solder components.

Electrical components can be stacked using interconnect technology. Interconnect technology can include the use of solder reflow to make electrical connections, the use of wiping contacts to make electrical connections, the use of filled adhesives to make electrical connections, and the use of sheet materials such as MPIs to make electrical connections. Each of these technologies has its advantages and can have different methods of establishing the connections. Printed circuit boards (PCBs) are used in many electronic products. As technology has advanced, electrical devices have become more compact and at the same time, the number of electrical components on a PCB continues to increase. As a result, the amount of space on a PCB has become an issue and electrical component stacking using interconnect technology is one way to address this issue.

SUMMARY

According to embodiments of the present disclosure, a method is disclosed for connecting electrical components. In various embodiments the method may include establishing an electrical connection between a first electrical component and a second electrical component using a compression tool to apply a compression force to an assembly. In certain embodiments the assembly may include the first electrical component, the second electrical component, a metallized particle interconnect (MPI) between the first electrical component and the second electrical component, and a set of solder components outside a boundary of the MPI and extending from the first electrical component to the second electrical component. The method may also include melting the set of solder components by applying heat to the assembly. In addition, the method may include solidifying the set of solder components by cooling the assembly. Furthermore, the method may include removing the compression tool.

According to embodiments of the present disclosure, a device is disclosed. In various embodiments, the device may include a first electrical component having a top surface and a bottom surface and having an electrical contact. The device may also include a second electrical component having a top surface and a bottom surface and having an electrical contact. In addition, the device may include a metallized particle interconnect (MPI) under compression between the first electrical component and the second electrical component having a top surface and a bottom surface and having conductive columns that extend from the top surface of the MPI to the bottom surface of the MPI. Furthermore, the device may include a set of solder components outside a boundary of the MPI and extending from the bottom surface of the first electrical component to the top surface of the second electrical component. The solder components may also be configured to maintain the compression of the MPI between the first electrical component and the second electrical component.

According to embodiments of the present disclosure, a kit is disclosed. In various embodiments, the kit may include a first electrical component configured to receive a compression force, having a solder pad configured to maintain compression and having an electrical contact. The kit may also include a second electrical component configured to receive the compression force, having a solder pad configured to maintain compression and having an electrical contact. Furthermore, the kit may include a metallized particle interconnect (MPI) configured to receive the compression force between the first electrical component and the second electrical component, having conductive columns that extend from a top surface of the MPI to a bottom surface of the MPI. The MPI may also be configured to electrically connect the electrical contact of the first electrical component and the electrical contact of the second electrical component.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
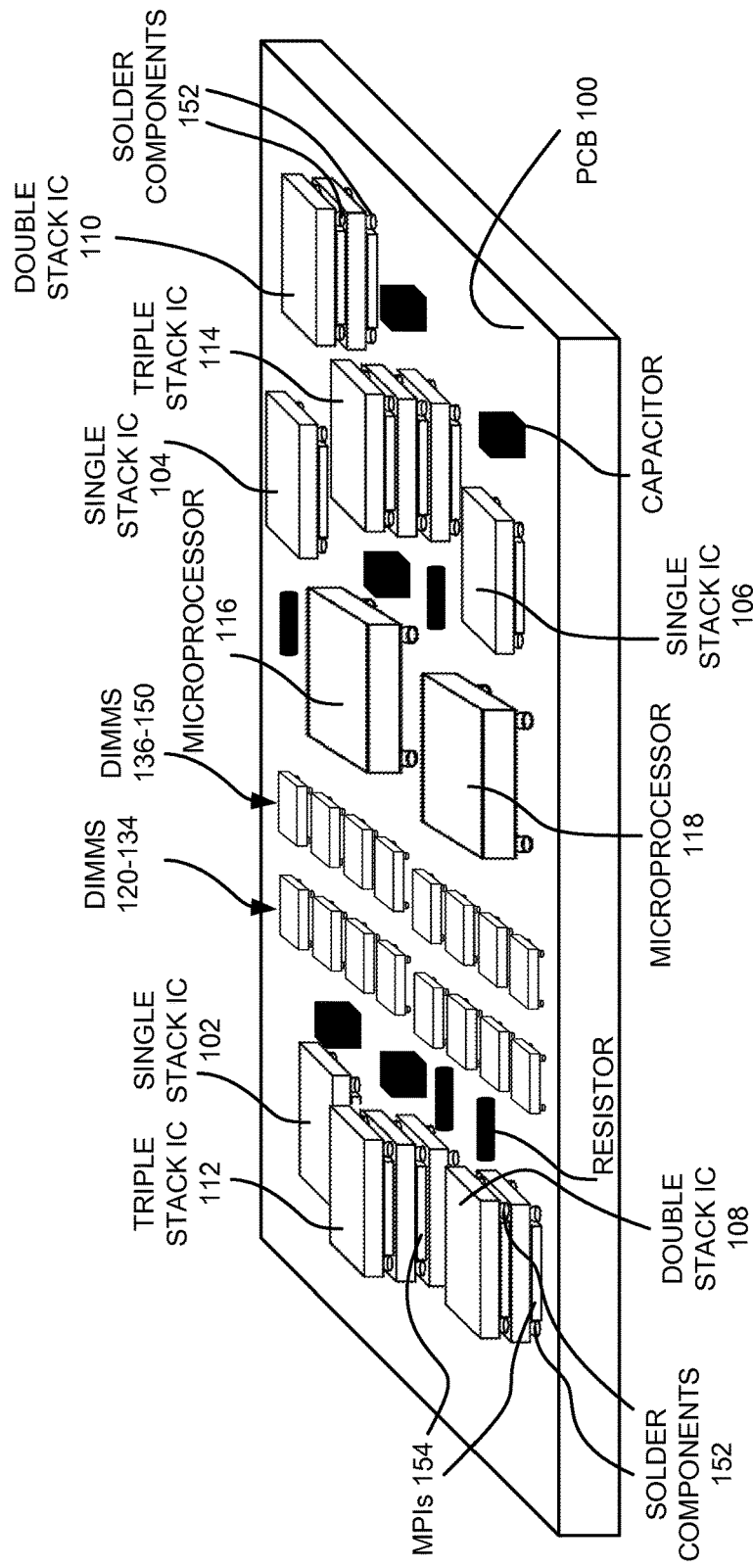
FIG. 1 depicts a PCB electrically connected to electrical components, consistent with embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to connecting electrical components, more particular aspects relate to connecting electrical components using a metallized particle interconnect (MPI) and solder components. While the present disclosure is not necessarily limited to such applications, various aspects of the disclosure may be appreciated through a discussion of various examples using this context.

Various embodiments of the present disclosure are directed toward a metallized particle interconnect (MPI) that electrically connects electrical components and is kept under compression between the electrical components using solder bonds. Accordingly, particular embodiments can use particle enhanced joining technology to provide electrical connections between the many various electrical components, sub-assemblies, and assemblies that can include, but are not limited to, integrated chips (ICs), printed circuit boards (PCBs), flexible electronics (e.g., backplanes), and electronic optical modules (e.g., detectors, transmitters, and sensors). Furthermore, in certain embodiments, the electrical components can have electrical contacts configured to allow current to flow to and from the electrical component. Metals used as electrical contacts can include, but are not limited to, aluminum, platinum, titanium, tungsten, chrome, nickel, gold, silicon, iron, copper, cobalt, silver, molybdenum, lead, tin, indium, and various alloys.

In various embodiments, a compression tool can be used to apply pressure to the electrical components and MPI. Solder reflow technology can then be used to create a bond between the electrical components. When the solder has cooled and the bond has formed, the compression tool can be removed and the solder bond can hold the electrical components in place. This can maintain the compression of the MPI between the electrical components in the absence of a compression tool and allow the MPI to maintain the electrical connection of the electrical components.

As discussed herein, an MPI can allow two or more electrical components to be electrically connected as an alternative to using solder connections, which require the application of heat. Instead of using heat to create electrical connections, electrical connections using MPIs can be created when the electrical components, having electrical contacts, are brought together under pressure. MPIs can be configured with conductive columns that are designed in a pattern to match the pattern of the electrical contacts. The conductive columns can be constructed from conductive particles embedded in the MPI and when the MPI is pressed against the electrical components (e.g., by using a compression tool) the conductive columns can impinge upon the electrical contacts, allowing an electrical connection to be established from one electrical component to another.

Various embodiments are directed towards electrical components and MPIs that are configured into many geometric shapes including flat, curved, and irregular. In particular embodiments, the electrical components and MPIs will have shapes that substantially mirror one another such that the two surfaces to be bonded may be brought together along a common interface. In other embodiments, the two surfaces may not mirror one another and it may be necessary to adjust the mating surfaces so they fit together.

Interconnect technology uses several methods for interconnecting electronic components. For instance, solder components (e.g., solder balls) can be used to electrically connect electrical components for digital applications. However, solder components can present a high-inductance path that could exceed 1 nH. While suitable for lower speed, digital links, the high-inductance path of a solder component possesses challenges for higher speed digital links, radio frequency (RF) applications, and high-transient current operations. MPIs can be used as an alternative electrical component connection that can have a comparatively low-inductance interconnect that, in particular embodiments, can reach below 0.3 nH. This can work well with high-speed digital links, RF applications, and high-transient current operations. However, an electrical component (e.g., PCBs) may not have the space for compression tools. These compression tools may be necessary to apply the compression for the MPI to work properly during the operation of the electrical component. Accordingly, in certain embodiments, when an electrical connection has been established, solder pads and solder components (e.g., solder balls) can be arranged outside a boundary of the MPI and reflow technology can be used to maintain the compression for the MPI to work properly.

Various embodiments are directed toward electrically connecting electrical components using surface-mount technology (SMT). SMT is a method for producing electrical circuits in which an electrical component is mounted or placed directly onto the surface of another electrical component. In particular embodiments, to mount electrical components, reflow soldering can be used. Reflow soldering is a process in which solder pads can be arranged and solder paste can be placed on the pads, heated, and then cooled to attach the electrical components. During reflow, a stencil can be used. The stencil can have apertures and a solder paste can be printed through a stencil aperture to form a bond that holds an electrical component in place and, when reflowed, secures it to another electrical component. As a result, the stencil apertures can determine the size, shape, and positioning of the solder components. For the electrical components to stay electrically connected, a reliable bond may be necessary to meet compression requirements of the MPI. The size, shape, and positioning of the solder components can all affect the reliability of the bond.

In various embodiments, the area and the shape of the MPI can affect the size, shape, and positioning of the solder components. In addition, multiple reflow processes can affect the strength of the solder components. To generate solder components with the size, shape, positioning, and strength that satisfy the MPI compression requirements, the stencil printing process may need to be considered. There can be many variables that influence the quality of the stencil printing process, which is measured by the amount and position of the solder components deposited. These variables can include, but are not limited to, stencil thickness, solder component type, electrical component finish, printing process speed, stencil aperture size, and stencil aperture shape. For example, the size and shape of the stencil aperture can determine the volume, uniformity and definition of a solder component. During the printing process, the ability of the solder component to release from the stencil can depend on an area ratio and an aspect ratio of the stencil. The area ratio can be defined as the ratio of the area of the stencil aperture to the area of a sidewall of the stencil aperture. The aspect ratio can be defined as the width of the inside wall of the stencil aperture divided by the thickness of the stencil. For mounting an electrical component to another electrical component, an area ratio greater than 0.66 and an aspect ratio greater than 1.5 can be acceptable. However, because various embodiments are directed toward solder components that are satisfying compression requirements of an MPI and may be subject to multiple reflow processes, in particular embodiments, the area ratio and aspect ratio may be larger than prior ratios.

Consistent with various embodiments, the size and configuration of the solder pads can be designed according to the bond failure strength of the particular solder being used and according to the pressure requirements of the MPI connector. For example, solder of type Sn3.5Ag having a solder diameter size of 0.76 mm, a solder pad size of 0.64 mm, and a solder pitch of 1.27 mm may experience bond failure at a pull strength of around 2800 grams after one reflow. An MPI connector may require 10 to 12 grams of contact pressure per electrical contact. The number and/or size of the pads can therefore be set as a function of the size of the MPI connector. Moreover, the pads can be designed for solder types having different melting points. For example, Sn3.5Ag may have a melting point of 221 degrees Celsius and a solder of type SAC can have a melting point of 217 degrees Celsius. Furthermore, SAC having a solder diameter size of 0.76 mm, a solder pad size of 0.64 mm, and a solder pitch of 1.27 mm may experience bond failure at a pull strength of around 2600 grams after one reflow. Thus, the pads can be designed for the worst case solder bond strength (e.g., SAC having a bond failure rate at a pull strength of around 2400 grams after six reflows) or a different pad design can be used for each level of a stacked device.

Particular embodiments are directed toward solder bonds that are designed to maintain the pressure first applied by a compression tool in order to establish the electrical connection before the reflow process. After reflow, the compression tool can then be removed, leaving the solder bond to counteract the repulsive force of the MPI on the electrical components. As a result, the MPI can maintain the interconnection of the electrical components, taking advantage of its low-inductance properties, and provide a solution for space critical applications, such as mobile devices.

In addition, because the solder bond maintains the compression on the MPI, a compression tool (e.g., a bolster plate and screws) that surrounds the electrical component may no longer be required, or may have reduced load requirements. In certain embodiments, this leads to extra space on the PCB. This space can be used for a variety of purposes that can include, but are not limited to, additional circuit components or a heat sink that is designed to cool the electrical component and may allow the electrical component to function more efficiently and for a longer period of time.

Furthermore, when dealing with electrical components, electromagnetic interference (EMI) is often a consideration. EMI are disturbance singles that interrupt, obstruct, degrade, or limit the effective performance of electrical components and electrical equipment. There may be instances where low frequency interference may be present. Therefore, in particular embodiments, where the solder bonds also establish an electrical connection between the electrical components, a grounding connection that decouples low frequency signals can be obtained, decreasing EMI emissions. For example, the ground or power from the PCB can be routed between the electrical components using the solder connections. In certain embodiments, data signals could also be routed using the solder connections.

Turning now to the figures, FIG. 1 depicts a PCB 100 electrically connected to electrical components, consistent with embodiments of the present disclosure. A PCB can include electrical components such as ICs (e.g., single stack ICs 102, 104, 106, double stack ICs 108, 110, and triple stack ICs 112, 114), microprocessors 116 and 118, memory modules (e.g., dual in line memory modules (DIMMs) and single in line memory modules (SIMMs)) 120-134 and 136-150, and passive electrical elements (e.g., resistors and capacitors) and wirings (not shown in FIG. 1) used to connect these electrical components. The electrical components can be connected to the PCB 100 using SMT. One method to mount electrical components to a PCB is using ball grid array (BGA) packaging. In certain embodiments, BGA packages can be used to mount microprocessors 116 and 118 to the PCB 100.

Consistent with embodiments, the single stack ICs 102, 104, 106, the double stack ICs 108, 110, and the triple stack ICs 112, 114 can be electrically connected to the PCB 100 (and to other ICs in the stack) using one or more MPIs (e.g., MPIs 154). For example, an electrical connection can be created by placing an MPI 154 between the double stack IC 108 and the PCB 100. MPI 154 can be configured with conductive columns (not shown in FIG. 1) designed in a pattern to match the pattern of the electrical contacts (not shown in FIG. 1) on the double stack IC 108 and the PCB 100. The double stack IC 108 and the PCB 100 can then be brought together under pressure using a compression tool (e.g., clamps and brackets). As a result, the MPI can press against the double stack IC and the PCB and the conductive columns can impinge upon the electrical contacts, allowing an electrical connection to be established between the double stack IC and the PCB.

The double stack IC 108 can then be mounted to the PCB 100 using reflow technology. For instance, solder pads (not shown in FIG. 1) can be arranged around the MPI 154 and solder components 152 can be placed on the pads to attach the double stack IC to the PCB. While the double stack IC and the PCB are compressed by a compression tool, heat can be applied to melt the solder components 152. Heating may be accomplished using several methods, including but not limited to, passing the PCB through a reflow oven, placing the PCB under an infrared lamp, or by melting individual solder components with a hot air pencil. The solder components can then be cooled, forming a bond that affixes the double stack IC to the PCB. The compression tool can then be removed, leaving the solder components to counteract the repulsive force of the MPI on the double stack IC and the PCB. As a result, the MPI can maintain the electrical connection between the double stack IC and the PCB.

The example above was described with respect to the double stack IC 108 and PCB 100. However, the example can also describe the single stack ICs 102, 104, and 106 or the triple stack ICs 112 and 114 being electrically connected and mounted to the PCB 100. Furthermore, a similar process can be used to assemble the double stack ICs 108, 110 and the triple stack ICs 112, 114 or multi-stack electrical components in general. For instance, the MPIs 154 can electrically connect a top and bottom electrical component comprising the double stack ICs 108 and 110 and the solder components 152 can mount the top electrical component to the bottom electrical component. The double stack ICs 108 and 110 can then be electrically connected and mounted to the PCB 100. In another embodiment, a single stack electrical component can be electrically connected to the PCB 100 and then multiple electrical components can be stacked on top, creating a multi-stack electrical component. In either embodiment multiple reflow steps can be used to place each IC and to form and fix each corresponding MPI connection. For example, higher temperature solder components can be used for the initial mounting and lower temperature solder components can be used for later mounting. This can ensure that the previously connected and mounted electrical components do not separate during the succeeding reflow processes.

Figure 2:
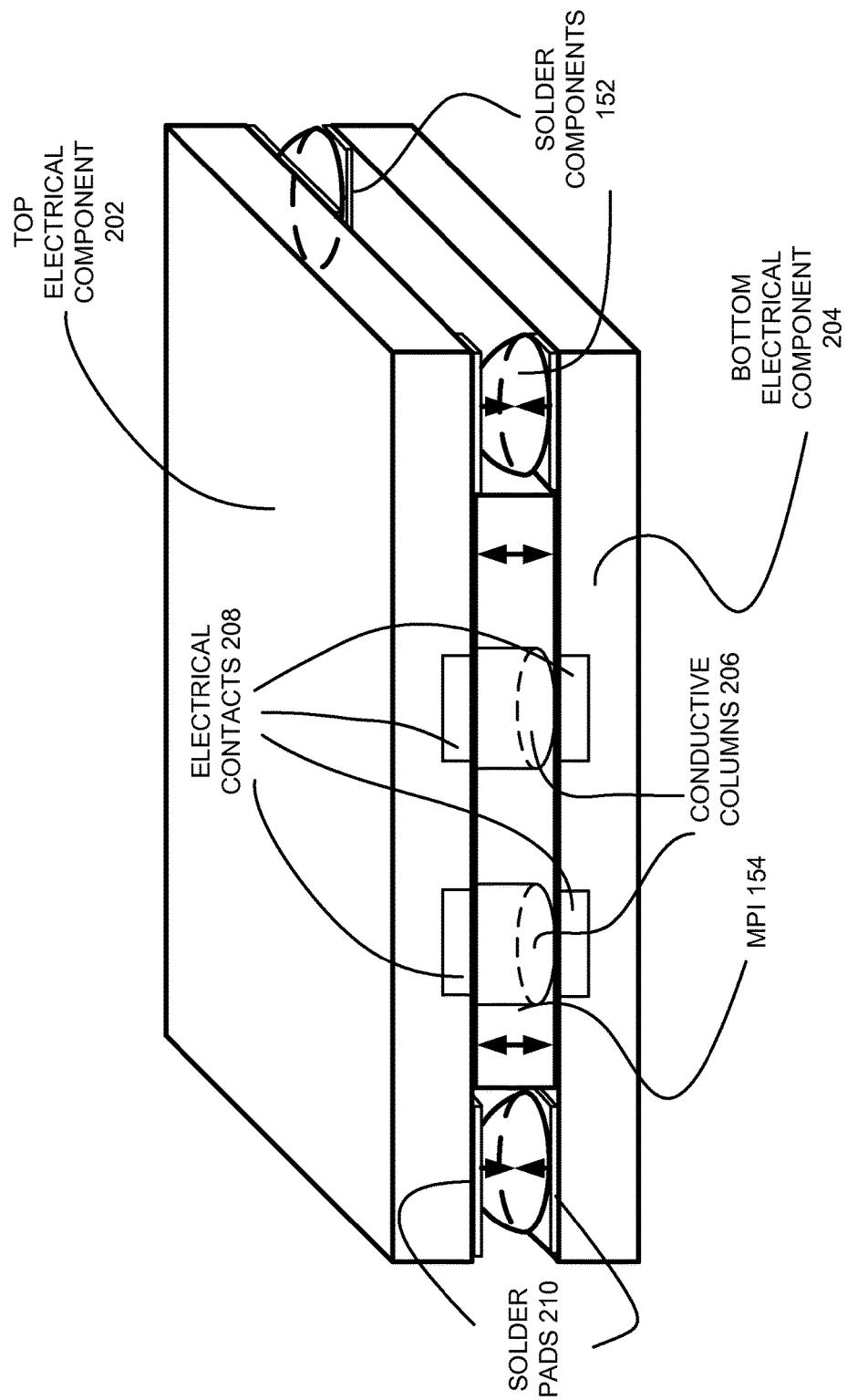
FIG. 2 depicts two electrical components electrically connected, consistent with embodiments of the present disclosure.

FIG. 2 depicts two electrical components electrically connected, consistent with embodiments of the present disclosure. A top electrical component 202 (e.g., an IC, a PCB, and a package (interface between an IC and a PCB)) can be electrically connected to a bottom electrical component 204 (e.g., an IC or PCB). Both electrical components 202 and 204 can be configured with electrical contacts 208. The electrical components 202 and 204 can be electrically connected using the MPI 154, configured with conductive columns 206, similar to the way the double stack IC was electrically connected to the PCB 100, described in FIG. 1. Furthermore, the top electrical component 202 can be mounted to the bottom electrical component 204 using solder pads 210 and solder components 152 similar to the way the double stack IC was mounted to the PCB 100, described in FIG. 1.

The double headed arrows shown in MPI 154 represent the repulsive force that the MPI displaces upon the top electrical component 202 and the bottom electrical component 204. The arrows shown in solder components 152 represent the compressive force that the solder components displace upon the top electrical component 202 and the bottom electrical component 204 to counteract the repulsive force. The solder components 152 may contain many different metals including, but not limited to, tin, copper, silver, bismuth, indium, zinc, and antimony. The solder components apply the compressive force that can replace the compressive force applied by a compression tool that is used to initially electrically connect the top electrical component 202 to the bottom electrical component 204. The compression tool can apply a force that is necessary for the electrical contacts 208 to make contact with the conductive columns 206. When the solder components 152 have cooled and the top electrical component 202 is mounted to the bottom electrical component 204, the compression tool can be removed. The solder components 152 can then continue to apply the compression force that keeps the electrical contacts 208 from being removed from the upper layer of the conductive columns 206.

Figure 3:
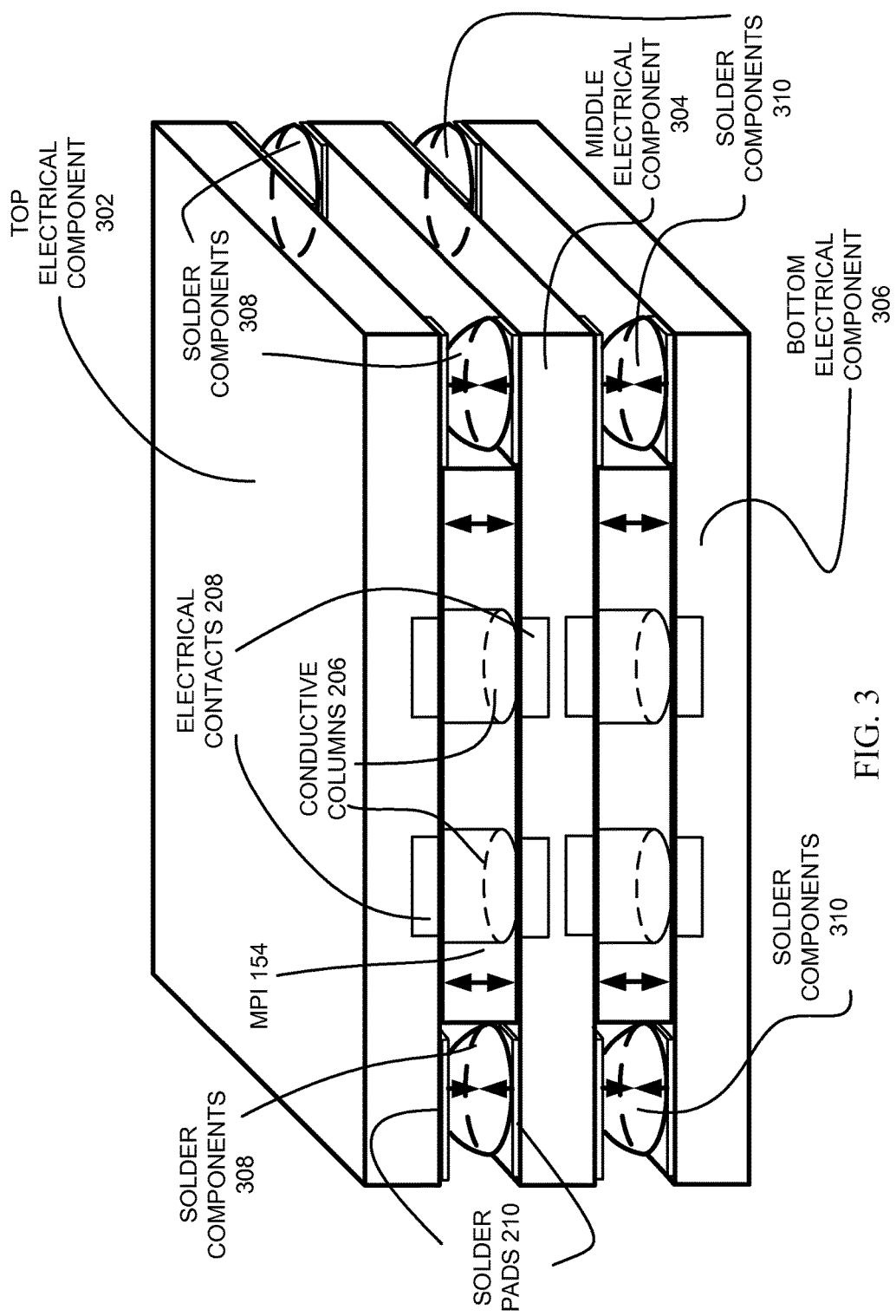
FIG. 3 depicts multi-stack electrical components electrically connected, consistent with embodiments of the present disclosure.

FIG. 3 depicts multi-stack electrical components electrically connected, consistent with embodiments of the present disclosure. Similar to FIG. 2, the double headed arrows in MPI 154 represent the repulsive force and the arrows shown in solder components 308 and 310 represent the compressive force counteracting the repulsive force. In certain embodiments where multiple reflows occur, it can be preferred to use solder components that have higher melting points in earlier reflows and solder components with lower melting points in later reflows. This can simplify the multi-stacking process. For instance, if solder components with higher melting points are used in earlier reflows, only one compression tool may need to be used multiple times to establish the initial electrical connection between the electrical components. However, if solder components with lower melting points are used in an earlier reflow, multiple compression tools may be needed to apply different amounts of compression to multiple electrical components to keep the electrical components from shifting and maintain electrical connections where the solder components have melted. For example, a top electrical component 302 can first be electrically connected to a middle electrical component 304 and then mounted to the middle electrical component using solder pads 210 and solder components 308. Then the middle electrical component 304 can be electrically connected to the bottom electrical component 306 and then mounted to the bottom electrical component using solder pads 210 and solder components 310. In this embodiment, the solder components 308 will be made of a material that has a higher melting point than solder components 310 so that when the reflow process is done again to mount the middle electrical component to the bottom electrical component, the solder components 308 will not melt.

In another embodiment, the middle electrical component 304 can first be electrically connected to the bottom electrical component 306 and then mounted to the bottom electrical component using solder pads 210 and solder components 310. Then the top electrical component 302 can be electrically connected to the middle electrical component 304 and then mounted to the middle electrical component 304 using solder pads 210 and solder components 308. In this embodiment, the solder components 310 will be made of a material that has a higher melting point than solder components 308 so that when the reflow process is done again to mount the top electrical component to the middle electrical component, the solder components 310 will not melt.

Figure 4:
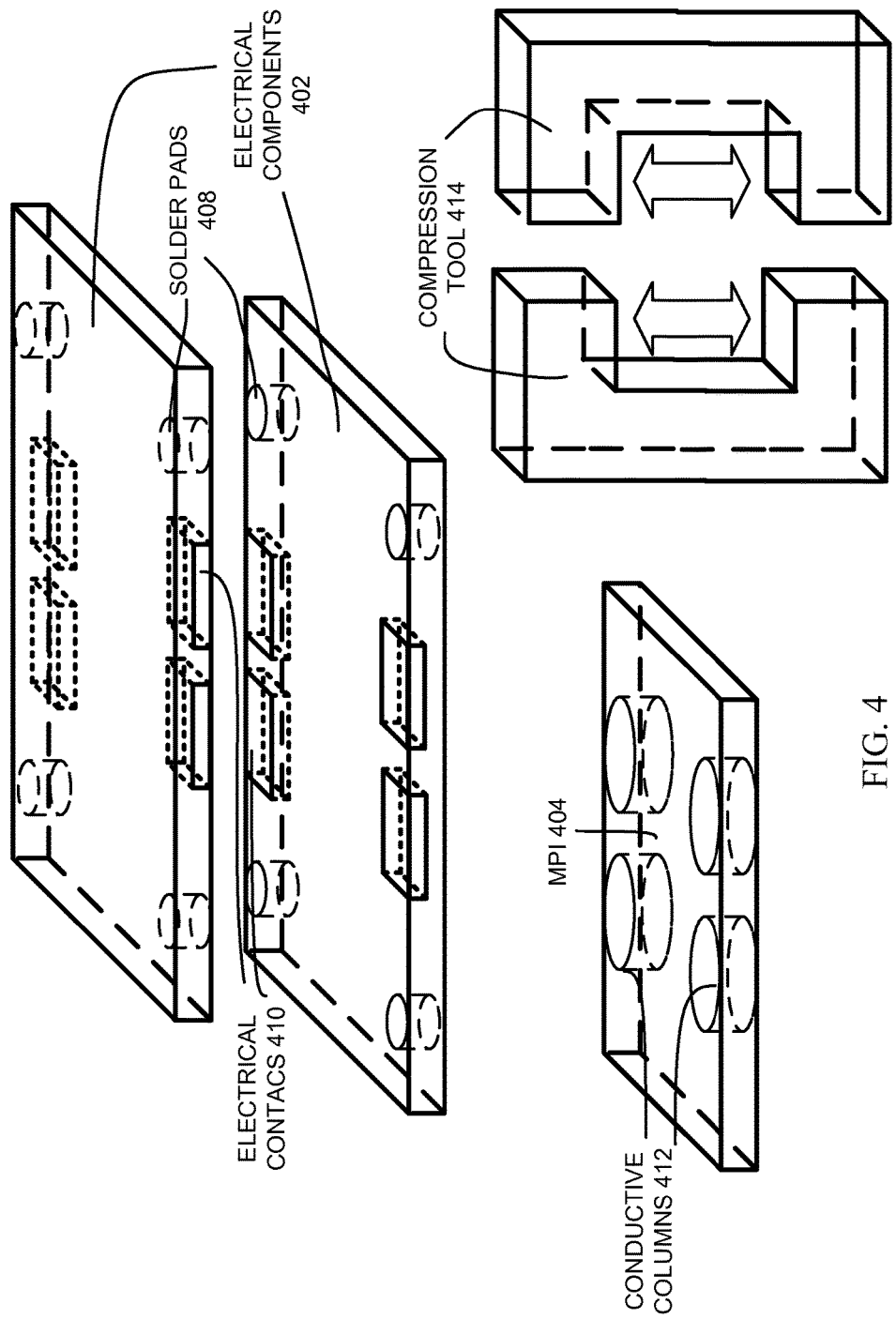
FIG. 4 depicts a kit for electrically connecting electrical components, consistent with embodiments of the present disclosure.

FIG. 4 depicts a kit 400 for electrically connecting electrical components, consistent with embodiments of the present disclosure. The kit 400 can include electrical components 402 configured with electrical contacts 410 and solder pads 408, an MPI 404 configured with conductive columns 412, and a compression tool 414. The electrical components 402 can be electrically connected using the MPI 404 and the compression tool 414, similar to the way the double stack IC 108 is electrically connected to the PCB 100, described in FIG. 1. The double headed arrows shown near the compression tool 414 illustrate the adjustability of the compression tool so that different amounts of pressure can be applied to the electrical components 402. Furthermore, the electrical components 402 can be mounted to one another using the solder pads 408, similar to the way the double stack IC 108 is mounted to the PCB 100, described in FIG. 1.

Figure 5:
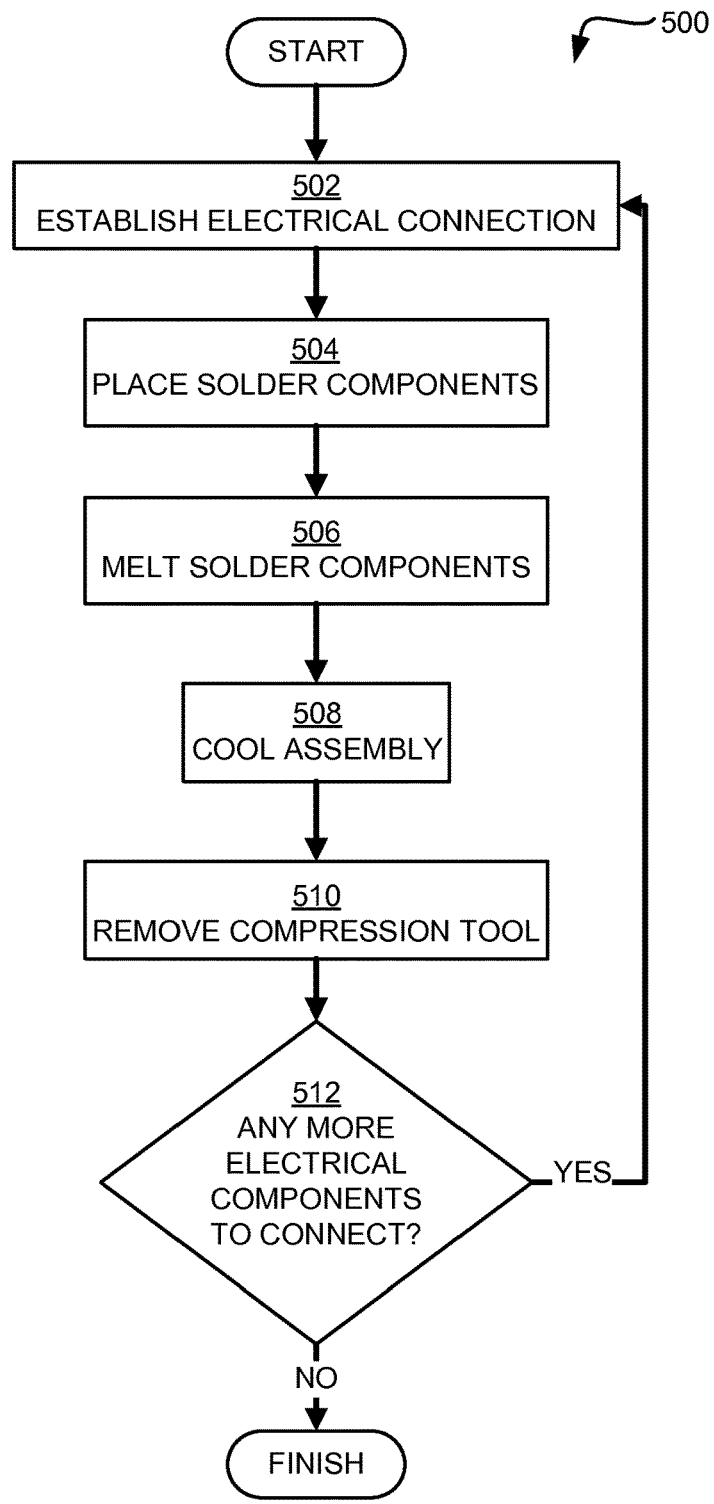
FIG. 5 depicts a method for connecting electrical components, consistent with embodiments of the present disclosure.

FIG. 5 depicts a method 500 for connecting electrical components, consistent with embodiments of the present disclosure. In operation 502, an electrical connection is established between a first electrical component and a second electrical component. The first electrical component and the second electrical component can both be configured with electrical contacts. The electrical connection can be established by placing an MPI between the first electrical contact and the second electrical contact. The MPI can be configured with conductive columns that are designed in a pattern to match the pattern of the electrical contacts. The MPI can then be compressed between the first electrical component and the second electrical component using a compression tool. During compression, the conductive columns can make contact with the electrical contacts, allowing an electrical connection to be established between the first electrical component and the second electrical component.

In operation 504, solder components can be placed on solder pads outside a boundary of the MPI. In operation 506, the solder components can be melted through the application of heat. In operation 508, the assembly including the electrical components, the MPI, the solder components, and the solder pads, can be cooled. When the solder components have solidified, a solder bond may have formed between the first electrical component and the second electrical component. The solder bond can maintain the pressure on the MPI that counteracts the repulsive force of the MPI on the first electrical component and the second electrical component. As a result, the compression from the compression tool may no longer be necessary and in operation 510, the compression tool can be removed. In operation 512, it is determined if there are anymore electrical components to connect. If there are, operations 502-510 are repeated. If there are not, method 500 is finished.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method for connecting electrical components, the method comprising:
establishing an electrical connection between a first electrical component and a second electrical component using a compression tool to apply a compression force to an assembly that includes:
the first electrical component,
the second electrical component,
an interconnect comprising a sheet of metal particles which under compression form conductive metal particle columns of distinct but electrically connected particles between the first electrical component and the second electrical component, and
a set of solder components outside a boundary of the interconnect and extending from the first electrical component to the second electrical component and directly contacting a solder pad of the first electrical component and a solder pad of the second electrical component;
melting the set of solder components by applying heat to the assembly; solidifying the set of solder components by cooling the assembly so that the solder components maintain the compression force applied by the compression tool; and removing the compression tool.

2. The method of claim 1, further comprising:
applying the solder components to a first set of solder pads located on the first electrical component.

3. The method of claim 2, further comprising:
applying the solder components to a second set of solder pads located on the second electrical component.

4. The method of claim 3, wherein the first set of solder pads and the second set of solder pads have sizes and a configuration according to a bond failure strength of the solder components.

5. The method of claim 1, wherein the solidifying of the solder components establishes a bond between the first electrical component and the second electrical component.

6. The method of claim 1, wherein the solidifying of the solder components establishes an electrical connection between the first electrical component and the second electrical component.

7. The method of claim 1, wherein the first electrical component and the second electrical component have electrical contacts that have a common pattern.

8. The method of claim 7, wherein the interconnect has conductive columns that extend from a top of the interconnect to a bottom of the interconnect and match the common pattern of the electrical contacts.

9. The method of claim 8, wherein the electrical connection is established by the conductive columns making contact with the electrical contacts when the compression force is applied.

* * * * *